(12) United States Patent
Wang et al.

(10) Patent No.: US 11,869,984 B2
(45) Date of Patent: Jan. 9, 2024

(54) SEMICONDUCTOR DEVICE AND FABRICATION METHOD THEREOF

(71) Applicant: CHANGXIN MEMORY TECHNOLOGIES, INC., Hefei (CN)

(72) Inventors: Lianhong Wang, Hefei (CN); Er-Xuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 186 days.

(21) Appl. No.: 17/401,317

(22) Filed: Aug. 13, 2021

(65) Prior Publication Data

US 2022/0069139 A1 Mar. 3, 2022

Related U.S. Application Data

(63) Continuation of application No. PCT/CN2021/103782, filed on Jun. 30, 2021.

(30) Foreign Application Priority Data

Aug. 28, 2020 (CN) .......................... 202010887358.6

(51) Int. Cl.
*H01L 29/861* (2006.01)
*H01L 29/66* (2006.01)

(52) U.S. Cl.
CPC .... *H01L 29/8611* (2013.01); *H01L 29/66128* (2013.01); *H01L 29/66136* (2013.01)

(58) Field of Classification Search
CPC ............ H01L 29/8611; H01L 29/66128; H01L 29/66136; H01L 29/402; H01L 29/4983;
(Continued)

(56) References Cited

U.S. PATENT DOCUMENTS

2002/0109153 A1* 8/2002 Ker ..................... H01L 29/7391
257/199
2005/0205938 A1 9/2005 Yagishita
(Continued)

FOREIGN PATENT DOCUMENTS

| CN | 102195623 A | 9/2011 |
| CN | 108336082 A | 7/2018 |
| CN | 111326589 A | 6/2020 |

*Primary Examiner* — Shahed Ahmed
(74) *Attorney, Agent, or Firm* — Kilpatrick Townsend & Stockton LLP

(57) ABSTRACT

Embodiment relates to the field of semiconductor technologies, and proposes a semiconductor device and a fabrication method thereof. The semiconductor device includes: a substrate, a semiconductor structure, an insulating layer, and a conductive layer. The semiconductor structure is positioned on a side of the substrate and includes a first semiconductor structure and a second semiconductor structure, wherein the first semiconductor structure and the second semiconductor structure form a PN junction. The insulating layer is positioned on a side of the semiconductor structure facing away from the substrate. The conductive layer is positioned on a side of the insulating layer facing away from the substrate, and an orthographic projection of the conductive layer on the substrate at least partially overlaps an orthographic projection of the PN junction on the substrate.

13 Claims, 3 Drawing Sheets

(58) Field of Classification Search
CPC ............. H01L 29/66356; H01L 29/861; H01L 29/7391; H01L 29/8613; H01L 29/4908; H01L 29/4916; H01L 29/66893–66924; H01L 29/66348; H01L 29/7428; H01L 21/761; H01L 29/0646
See application file for complete search history.

(56)     References Cited

U.S. PATENT DOCUMENTS

| | | |
|---|---|---|
| 2009/0168492 A1 | 7/2009 | Thorp et al. |
| 2013/0161750 A1 | 6/2013 | Chen et al. |
| 2013/0181286 A1* | 7/2013 | Zhang .................. H01L 29/665 257/E29.256 |
| 2016/0247917 A1 | 8/2016 | Kondo et al. |
| 2017/0148871 A1* | 5/2017 | Kocon ................ H01L 29/7811 |
| 2018/0358352 A1* | 12/2018 | Voldman ............. H01L 27/0255 |

* cited by examiner

SEMICONDUCTOR DEVICE AND FABRICATION METHOD THEREOF

CROSS REFERENCE TO RELATED APPLICATION

This is a continuation application of International Patent Application No. PCT/CN2021/103782, filed on Jun. 30, 2021, which claims priority to Chinese Patent Application No. 202010887358.6 titled "SEMICONDUCTOR DEVICE AND FABRICATION METHOD THEREOF" and filed on Aug. 28, 2020, the entire contents of which are incorporated herein by reference in their entireties.

TECHNICAL FIELD

The present disclosure relates to the field of semiconductor technologies, and more particularly, to a semiconductor device and a fabrication method thereof.

BACKGROUND

As a diode decreases in size, total electric current flowing through the diode decreases accordingly. To increase the total electric current of the small-sized diode, in related technologies, generally a PN junction of the diode is designed as an abrupt junction, such that the total electric current of the diode is increased by increasing an electric current density of the diode under the same voltage. However, the diode provided with the abrupt junction has a small reverse breakdown voltage and a larger reverse current.

It is to be noted that the information disclosed in the above background art section is only for enhancement of understanding of the background of the present disclosure, and therefore may contain information that does not constitute the prior art that is already known to a person of ordinary skill in the art.

SUMMARY

An objective of the present disclosure is to provide a semiconductor device and a fabrication method thereof.

Other features and advantages of the present disclosure will become apparent from the following detailed description, or may be learned in part by practice of the present disclosure.

According to one aspect of the present disclosure, there is provided a semiconductor device. The semiconductor device includes a substrate, a semiconductor structure, an insulating layer, and a conductive layer. The semiconductor structure is positioned on a side of the substrate and includes a first semiconductor structure and a second semiconductor structure, wherein the first semiconductor structure and the second semiconductor structure form a PN junction. The insulating layer is positioned on a side of the semiconductor structure facing away from the substrate. The conductive layer is positioned on a side of the insulating layer facing away from the substrate, and an orthographic projection of the conductive layer on the substrate at least partially overlaps an orthographic projection of the PN junction on the substrate. The conductive layer is configured to reduce a potential barrier of the PN junction formed by the first semiconductor structure and the second semiconductor structure.

According to one aspect of the present disclosure, there is provided a method for fabricating a semiconductor device, including:

forming a substrate;

forming a semiconductor structure on a side of the substrate, the semiconductor structure comprising a first semiconductor structure and a second semiconductor structure, the first semiconductor structure and the second semiconductor structure forming a PN junction;

forming an insulating layer on a side of the semiconductor structure facing away from the substrate; and forming a conductive layer on a side of the insulating layer facing away from the substrate, an orthographic projection of the conductive layer on the substrate at least partially overlapping an orthographic projection of the PN junction on the substrate.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

The exemplary embodiments will now be described more fully with reference to the accompanying drawings. However, the exemplary embodiments can be implemented in a variety of forms and should not be construed as limited to the embodiments set forth herein. Rather, the embodiments are provided so that the present disclosure will be thorough and complete and will fully convey the concepts of exemplary embodiments to those skilled in the art. Throughout the drawings, similar reference signs indicate the same or similar structures, and their detailed description will be omitted.

Although this specification employs relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". Other relative terms such as "high", "low", "top", "bottom", "left", "right" and so on also have similar meanings. When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc.

Figure 1:
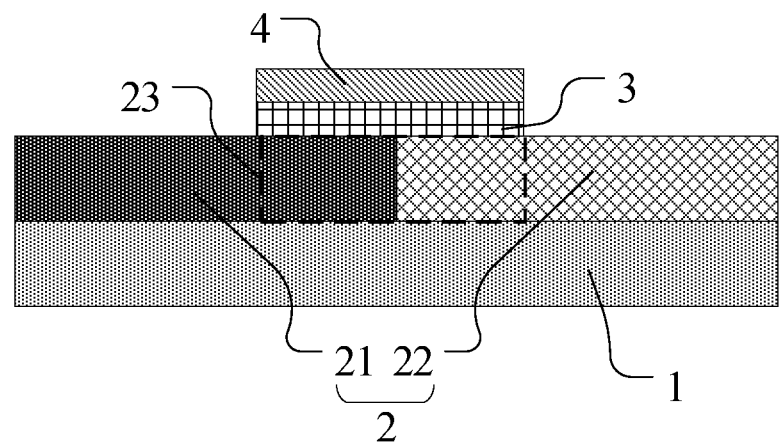
FIG. 1 is a schematic structural diagram of a semiconductor device according to an exemplary embodiment of the present disclosure.

This exemplary embodiment provides a semiconductor device, as shown in FIG. 1, a schematic structural diagram of the semiconductor device according to an exemplary embodiment of the present disclosure is illustrated. The semiconductor device includes: a substrate 1, a semiconductor structure 2, an insulating layer 3, and a conductive layer 4. The semiconductor structure 2 is positioned on a side of the substrate 1 and includes a first semiconductor structure 21 and a second semiconductor structure 22, wherein the first semiconductor structure 21 and the second semiconductor structure 22 form a PN junction 23. The insulating layer 3 is positioned on a side of the semiconductor structure 2 facing away from the substrate 1. The conductive layer 4 is positioned on a side of the insulating layer 3 facing away from the substrate 1, and an orthographic projection of the conductive layer 4 on the substrate 1 at least partially overlaps an orthographic projection of the PN junction 23 on the substrate 1. The conductive layer is configured to reduce a potential barrier of the PN junction formed by the first semiconductor structure and the second semiconductor structure.

In this exemplary embodiment, the conductive layer 4 may act on a part of the semiconductor structure that overlaps the orthographic projection of the conductive layer 4 on the substrate 1, to change a Fermi energy level of this part of the semiconductor structure. When the Fermi energy level of the conductive layer 4 is greater than that of the semiconductor structure, the conductive layer 4 can pull up the Fermi energy level of the semiconductor structure. When the Fermi energy level of the conductive layer 4 is less than that of the semiconductor structure, the conductive layer 4 can pull down the Fermi energy level of the semiconductor structure. The orthographic projection of the conductive layer 4 on the substrate 1 at least partially overlaps the orthographic projection of the PN junction 23 on the substrate 1. Therefore, the conductive layer 4 can change the Fermi energy level of the first semiconductor structure 21 and/or the second semiconductor structure 22, such that a differential between initial Fermi energy levels of a part of the first semiconductor structure 21 and of a part of the second semiconductor structure 22 positioned at the PN junction may be reduced by designing Fermi energy levels for different locations of the conductive layer. In this way, the potential barrier of the PN junction is reduced, and an electric current density of the semiconductor structure under the same voltage is increased. The initial Fermi energy levels of a part of the first semiconductor structure 21 and of a part of the second semiconductor structure 22 positioned at the PN junction refer to the Fermi energy levels, when the PN junction is not formed, of the part of the first semiconductor structure 21 and of the part of the second semiconductor structure 22 positioned at the PN junction.

Figure 2:
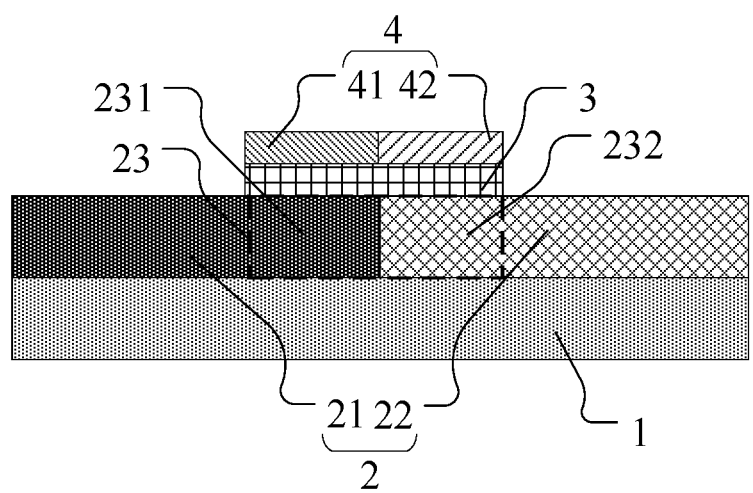
FIG. 2 is a schematic structural diagram of a semiconductor device according to another exemplary embodiment of the present disclosure.

As shown in FIG. 2, a schematic structural diagram of the semiconductor device according to another exemplary embodiment of the present disclosure is illustrated. In this exemplary embodiment, the conductive layer 4 may include a first conductive layer 41 and a second conductive layer 42. An orthographic projection of the first conductive layer 41 on the substrate 1 may be positioned on an orthographic projection of the first semiconductor structure 21 on the substrate 1, and the orthographic projection of the first conductive layer 41 on the substrate 1 may at least partially overlap the orthographic projection of the PN junction 23 on the substrate 1. An orthographic projection of the second conductive layer 42 on the substrate 1 may be positioned on an orthographic projection of the second semiconductor structure 22 on the substrate 1, and the orthographic projection of the second conductive layer 42 on the substrate 1 may at least partially overlap the orthographic projection of the PN junction 23 on the substrate 1.

Figure 3:
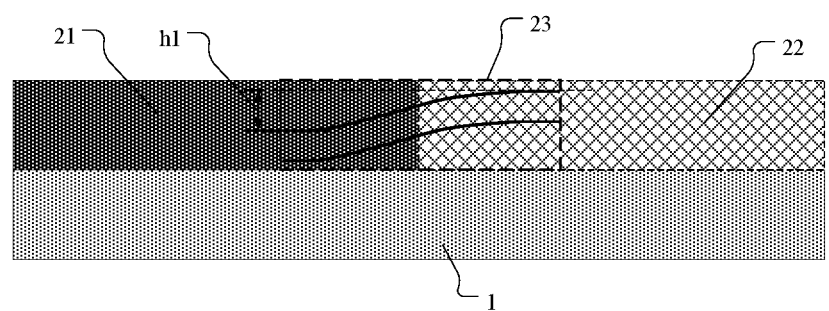
FIG. 3 is a schematic structural diagram of a semiconductor device in the existing technologies.
Figure 4:
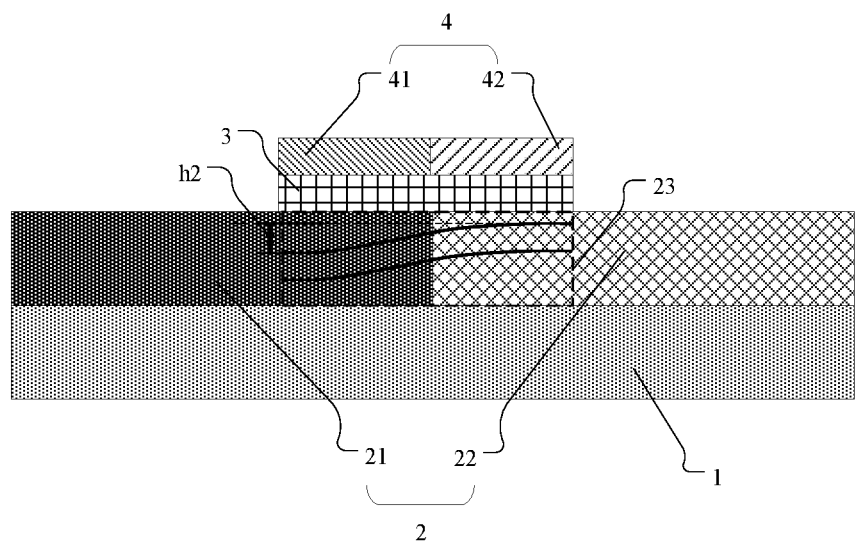
FIG. 4 is a schematic structural diagram of a semiconductor device according to still another exemplary embodiment of the present disclosure.

In this exemplary embodiment, as shown in FIG. 2, the PN junction 23 may comprise a first structure portion 231 positioned in the first semiconductor structure 21 and a second structure portion 232 positioned in the second semiconductor structure 22. The orthographic projection of the first conductive layer 41 on the substrate 1 may overlay the orthographic projection of the first structure portion 231 on the substrate 1. The orthographic projection of the second conductive layer 42 on the substrate 1 may overlay the orthographic projection of the second structure portion 232 on the substrate 1. As shown in FIG. 2, when the Fermi energy level of a material of the first semiconductor structure 21 is greater than the Fermi energy level of a material of the second semiconductor structure 22, the Fermi energy level of a material of the first conductive layer 41 may be less than the Fermi energy level of the material of the first semiconductor structure 21, and the Fermi energy level of the material of the second conductive layer 42 may be greater than the Fermi energy level of the material of the second semiconductor structure 22. For example, the material of the first semiconductor structure 21 may be an N-type semiconductor, and the material of the second semiconductor structure 22 may be a P-type semiconductor. The first conductive layer 41 may be a polysilicon conductor doped with P-type ions, and the second conductive layer 42 may be a polysilicon conductor doped with N-type ions. The first conductive layer 41 can pull down the Fermi energy level of the first structure portion 231 because the Fermi energy level of the material of the first conductive layer 41 is less than the Fermi energy level of the material of the first semiconductor structure 21. The second conductive layer 42 can pull up the Fermi energy level of the second structure portion 232 because the Fermi energy level of the material of the second conductive layer 42 is greater than the Fermi energy level of the material of the second semiconductor structure 22. Therefore, the differential between the Fermi energy level of the first semiconductor structure 21 and the Fermi energy level of the second semiconductor structure 22 is reduced. In this way, the potential barrier of the PN junction is reduced, and the electric current density of the semiconductor structure under the same voltage is increased. As shown in FIG. 3 and FIG. 4, FIG. 3 is a schematic structural diagram of a semiconductor device in the existing technologies, and FIG. 4 is a schematic structural diagram of the semiconductor device according to still another exemplary embodiment of the present disclosure. In the existing technologies, the semiconductor device includes a substrate 1, a first semiconductor structure 21, and a second semiconductor structure 22. The first semiconductor structure 21 may be an N-type semiconductor, and the second semiconductor structure may be a P-type semiconductor. A PN junction is formed between the first semiconductor structure 21 and the second semiconductor structure 22. As shown in FIG. 3, FIG. 3 illustrates an energy band diagram of the PN junction 23. As can be seen from FIG. 3, the PN junction in the existing technologies has a potential barrier h1. As shown in FIG. 4, in the present disclosure, the first semiconductor structure 21 may also be an N-type semiconductor, and the second semiconductor structure 22 may also be a P-type semiconductor. FIG. 4 also illustrates an energy band diagram of the PN junction in the semiconductor structure of the present disclosure. As can be seen from FIG. 4, the PN junction in the present disclosure has a potential barrier h2, and apparently, h2 is smaller than h1.

It is to be understood that in other exemplary embodiments, the first semiconductor structure 21 may also be a P-type semiconductor, and the second semiconductor structure 22 may also be an N-type semiconductor. In this case, the first conductive layer may be a polysilicon conductor doped with the N-type ions, and the second conductive layer may be a polysilicon conductor doped with the P-type ions.

It is to be understood that the Fermi energy level of the material of the first conductive layer 41 also may be equal to the Fermi energy level of the material of the second conductive layer 42, as long as the Fermi energy level of the material of the first conductive layer 41 and the Fermi energy level of the material of the second conductive layer 42 both are between the Fermi energy level of the material of the first semiconductor structure 21 and the Fermi energy level of the material of the second semiconductor structure 22. In this way, the effect of reducing the differential between the Fermi energy level of the first semiconductor structure 21 and the Fermi energy level of the second semiconductor structure 22 can be implemented.

In addition, it is to be noted that the Fermi energy level of the material of the first conductive layer 41 and the Fermi energy level of the material of the second conductive layer 42 may also both be greater than or less than the Fermi energy level of the material of the first semiconductor structure 21 and the Fermi energy level of the material of the second semiconductor structure 22. In this exemplary embodiment, reference is made by taking an example where the first semiconductor structure is an N-type semiconductor and the second semiconductor structure is a P-type semiconductor. That is, the Fermi energy level of the material of the first semiconductor structure is greater than the Fermi energy level of the material of the second semiconductor structure. When the Fermi energy level of the material of the first conductive layer 41 and the Fermi energy level of the material of the second conductive layer 42 both are greater than the Fermi energy level of the material of the first semiconductor structure 21 and the Fermi energy level of the material of the second semiconductor structure 22, and when the differential obtained by subtracting the Fermi energy level of the material of the first semiconductor structure 21 from the Fermi energy level of the material of the first conductive layer 41 is less than the differential obtained by subtracting the Fermi energy level of the material of the second semiconductor structure 22 from the Fermi energy level of the material of the second conductive layer 42, a degree of pulling up the Fermi energy level of the first semiconductor structure 21 by the first conductive layer 41 is less than a degree of pulling up the Fermi energy level of the second semiconductor structure 22 by the second conductive layer 42. In this case, the differential between the Fermi energy level of the first semiconductor structure 21 and the Fermi energy level of the second semiconductor structure 22 still can be reduced, and thus the potential barrier of the PN junction is reduced, and the electric current density of the PN junction under the same voltage is increased. When the Fermi energy level of the first conductive layer 41 and the Fermi energy level of the second conductive layer 42 both are less than the Fermi energy level of the first semiconductor structure and the Fermi energy level of the second semiconductor structure, and when the differential obtained by subtracting the Fermi energy level of the material of the first conductive layer 41 from the Fermi energy level of the material of the first semiconductor structure 21 is greater than the differential obtained by subtracting the Fermi energy level of the material of the second conductive layer 42 from the Fermi energy level of the material of the second semiconductor structure 22, the degree of pulling down the Fermi energy level of the first semiconductor structure 21 by the first conductive layer 41 is greater than the degree of pulling down the Fermi energy level of the second semiconductor structure 22 by the second conductive layer 42. In this case, the differential between the Fermi energy level of the first semiconductor structure 21 and the Fermi energy level of the second semiconductor structure 22 still can be reduced, and thus the potential barrier of the PN junction is reduced, and the electric current density of the PN junction under the same voltage is increased.

In this exemplary embodiment, the first conductive layer 41 and the second conductive layer 42 may be an integrative structure. That is, the first conductive layer 41 and the second conductive layer 42 may be formed by an entire layer of polysilicon based on different types of doping. It is to be understood that in other exemplary embodiments, the first conductive layer and the second conductive layer may also be insulated from each other. The substrate 1 may be a lightly-doped N-type or P-type semiconductor. Leakage current of the substrate 1 can be reduced by designing the substrate 1 as the lightly-doped N-type or P-type semiconductor.

Figure 5:
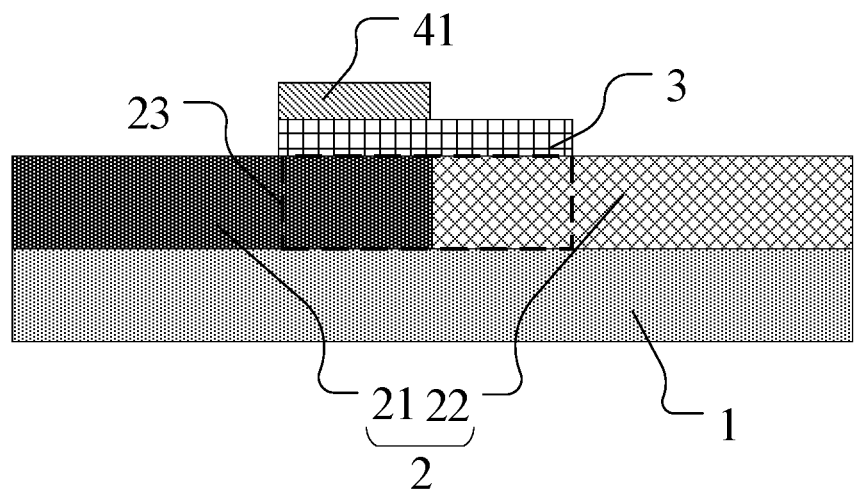
FIG. 5 is a schematic structural diagram of a semiconductor device according to still another exemplary embodiment of the present disclosure.

As shown in FIG. 5, a schematic structural diagram of the semiconductor device according to still another exemplary embodiment of the present disclosure is illustrated. The conductive layer 4 may merely include the first conductive layer 41. The orthographic projection of the first conductive layer 41 on the substrate 1 may be positioned on the orthographic projection of the first semiconductor structure 21 on the substrate 1, and the orthographic projection of the first conductive layer 41 on the substrate 1 may at least partially overlap the orthographic projection of the PN junction 23 on the substrate 1. When the Fermi energy level of the material of the first semiconductor structure 21 is greater than the Fermi energy level of the material of the second semiconductor structure 22, the Fermi energy level of the material of the first conductive layer 41 may be less than the Fermi energy level of the material of the first semiconductor structure 21. For example, the material of the first semiconductor structure 21 may be the N-type semiconductor, and the material of the second semiconductor structure 22 may be the P-type semiconductor. The first conductive layer 41 may be a polysilicon conductor doped with the P-type ions. The first conductive layer 41 can pull down the Fermi energy level of at least a part of the first semiconductor structure 21 positioned at the PN junction because the Fermi energy level of the material of the first conductive layer 41 is less than the Fermi energy level of the material of the first semiconductor structure 21. Therefore, the differential between the Fermi energy level of the first semiconductor structure 21 and the Fermi energy level of the second semiconductor structure 22 is reduced, such that the potential barrier of the PN junction is reduced, and the electric current density of the PN junction under the same voltage is increased. When the Fermi energy level of the material of the first semiconductor structure 21 is less than the Fermi energy level of the material of the second semiconductor structure 22, the Fermi energy level of the material of the first conductive layer 41 may be greater than the Fermi energy level of the material of the first semiconductor structure 21. For example, the material of the first semiconductor structure 21 may be the P-type semiconductor, and the material of the second semiconductor structure 22 may be the N-type semiconductor. The first conductive layer 41 may be a polysilicon conductor doped with the N-type ions. The first conductive layer 41 can pull up the Fermi energy level of at least a part of the first semiconductor structure 21 positioned at the PN junction because the Fermi energy level of the material of the first conductive layer 41 is greater than the Fermi energy level of the material of the first semiconductor structure 21. Therefore, the differential between the Fermi energy level of the first semiconductor structure 21 and the Fermi energy level of the second semiconductor structure 22 is reduced, such that the potential barrier of the PN junction is reduced, and the electric current density of the PN junction under the same voltage is increased.

This exemplary embodiment also provides a method for fabricating a semiconductor device, including following steps.

Step S1: forming a substrate.

Step S2: forming a semiconductor structure on a side of the substrate, wherein the semiconductor structure comprises a first semiconductor structure and a second semiconductor structure, and the first semiconductor structure and the second semiconductor structure form a PN junction.

Step S3: forming an insulating layer on a side of the semiconductor structure facing away from the substrate.

Step S4: forming a conductive layer on a side of the insulating layer facing away from the substrate, wherein an orthographic projection of the conductive layer on the substrate at least partially overlaps an orthographic projection of the PN junction on the substrate.

The above steps are described in detail below.

Figure 6:
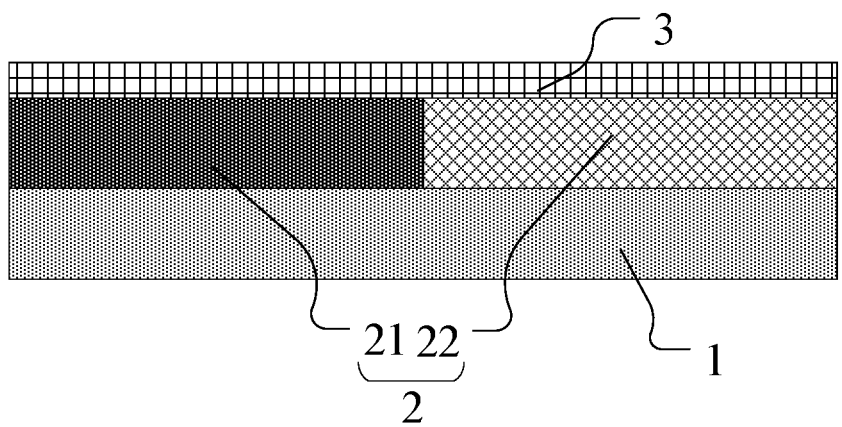
FIG. 6 is a schematic structural diagram of a semifinished product of a semiconductor device fabricated by means of a method for fabricating a semiconductor device according to an exemplary embodiment of the present disclosure.

FIG. 6 illustrates a schematic structural diagram of a semifinished product of a semiconductor device fabricated by means of a method for fabricating a semiconductor device according to an exemplary embodiment of the present disclosure. In Step S2, forming a semiconductor structure 2 on one side of the substrate may include: providing a semiconductor base, wherein the semiconductor base may be a lightly-doped P-type or N-type semiconductor. Next, heavy N-type doping and P-type doping may be performed on the semiconductor base to form the first semiconductor structure 21 and the second semiconductor structure 22 from a part of the semiconductor base. The remaining part of the semiconductor base may form the substrate in Step S1. As shown in FIG. 6, Step S3 may include: forming an insulating layer 3 on a side of the semiconductor structure 2 facing away from the substrate 1. The insulating layer may be silicon oxide.

Figure 7:
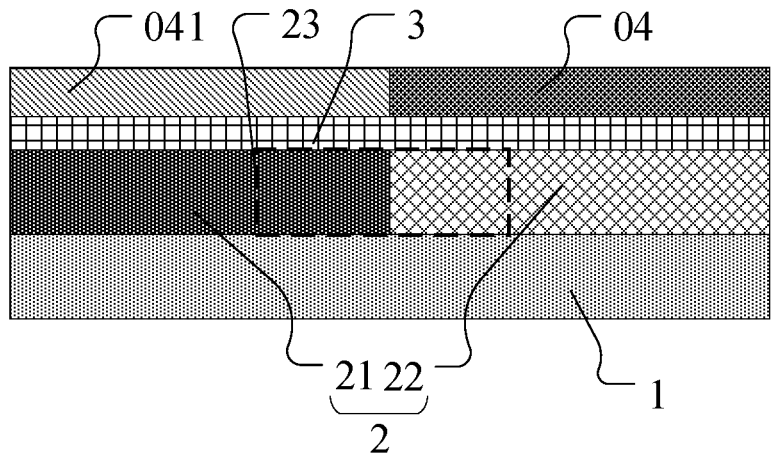
FIG. 7 is a schematic structural diagram of a semifinished product of a semiconductor device fabricated by means of a method for fabricating a semiconductor device according to an exemplary embodiment of the present disclosure.

FIG. 7 illustrates a schematic structural diagram of a semifinished product of a semiconductor device fabricated by means of a method for fabricating a semiconductor device according to an exemplary embodiment of the present disclosure. In this exemplary embodiment, the material of the first semiconductor structure 21 may be an N-type semiconductor, and the material of the second semiconductor structure 22 may be a P-type semiconductor. In Step S4, forming a conductive layer on the side of the insulating layer 3 facing away from the substrate 1 may include: first forming a polysilicon layer 04 on the side of the insulating layer 3 facing away from the substrate 1, and performing P-type doping on a first polysilicon portion 041, of the polysilicon layer 04, positioned directly above the first semiconductor structure. An orthographic projection of the first polysilicon portion 041 on the substrate 1 is positioned on the orthographic projection of the first semiconductor structure 21 on the substrate 1, and the orthographic projection of the first polysilicon portion 041 on the substrate 1 at least partially overlaps the orthographic projection of the PN junction 23 on the substrate 1.

Figure 8:
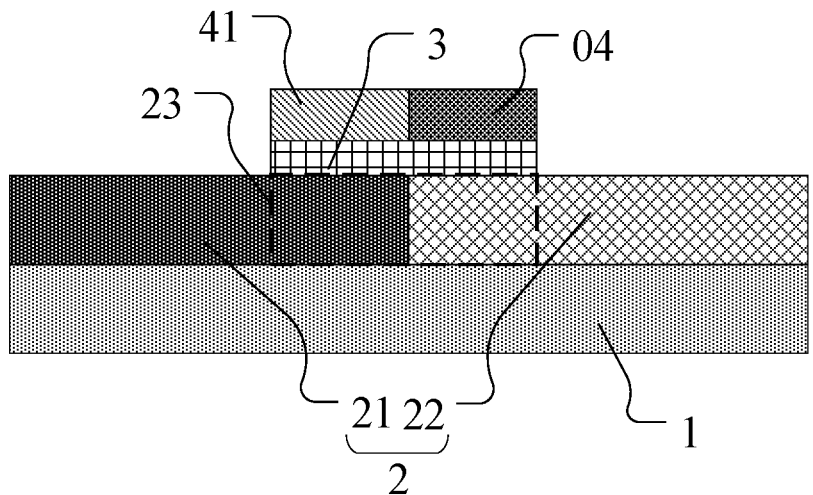
FIG. 8 is a schematic structural diagram of a semifinished product of a semiconductor device fabricated by means of a method for fabricating a semiconductor device according to an exemplary embodiment of the present disclosure.

FIG. 8 illustrates a schematic structural diagram of a semifinished product of a semiconductor device fabricated by means of a method for fabricating a semiconductor device according to an exemplary embodiment of the present disclosure. In Step S4, forming a conductive layer on the side of the insulating layer 3 facing away from the substrate 1 may also include: etching the polysilicon layer 04 and the insulating layer 3, such that an orthographic projection of a remaining part of the first polysilicon portion 041 on the substrate 1 at least partially overlaps the orthographic projection, on the substrate 1, of a part of the first semiconductor structure positioned at the PN junction 23, wherein the remaining part of the first polysilicon portion 041 forms the first conductive layer 41. The orthographic projection of the remaining part of the polysilicon layer 04 on the substrate 1 at least partially overlaps the orthographic projection, on the substrate 1, of a part of the second semiconductor structure positioned at the PN junction 23.

Figure 9:
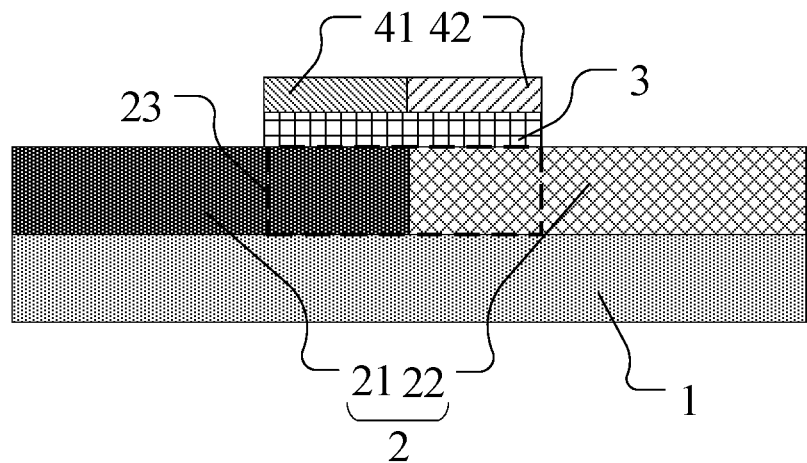
FIG. 9 is a schematic structural diagram of a finished product of a semiconductor device fabricated by means of a method for fabricating a semiconductor device according to an exemplary embodiment of the present disclosure.

FIG. 9 illustrates a schematic structural diagram of a finished product of a semiconductor device fabricated by means of a method for fabricating a semiconductor device according to an exemplary embodiment of the present disclosure. In Step S4, forming a conductive layer on the side of the insulating layer 3 facing away from the substrate 1 may further include: performing N-type ion doping on a second polysilicon portion, of the polysilicon layer 04, positioned directly above the second semiconductor structure 22, to form a second conductive layer 42. An orthographic projection of the second conductive layer 42 on the substrate 1 is positioned on an orthographic projection of the second semiconductor structure 22 on the substrate 1, and the orthographic projection of the second conductive layer 42 on the substrate 1 at least partially overlaps the orthographic projection of the PN junction 23 on the substrate 1. The first conductive layer and the second conductive layer constitute the conductive layer.

Other embodiments of the present disclosure will be apparent to those skilled in the art from consideration of the specification and practice of the contents disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A semiconductor device, comprising:
   a substrate;
   a semiconductor structure positioned on a side of the substrate, the semiconductor structure comprising a first semiconductor structure and a second semiconductor structure, the first semiconductor structure and the second semiconductor structure forming a PN junction;
   an insulating layer, positioned on a side of the semiconductor structure facing away from the substrate; and
   a conductive layer positioned on a side of the insulating layer facing away from the substrate, an orthographic projection of the conductive layer on the substrate at least partially overlapping an orthographic projection of the PN junction on the substrate;
   wherein the conductive layer is configured to reduce a potential barrier of the PN junction formed by the first semiconductor structure and the second semiconductor structure;
   wherein the conductive layer comprises a first conductive layer and a second conductive layer, the first conductive layer is a polysilicon conductor doped with a P-type ion, and the second conductive layer is a polysilicon conductor doped with an N-type ion.

2. The semiconductor device according to claim 1, wherein an orthographic projection of the first conductive layer on the substrate is positioned on an orthographic projection of the first semiconductor structure on the substrate, and the orthographic projection of the first conductive layer on the substrate at least partially overlapping the orthographic projection of the PN junction on the substrate; and
   an orthographic projection of the second conductive layer on the substrate is positioned on an orthographic projection of the second semiconductor structure on the substrate, and the orthographic projection of the second conductive layer on the substrate at least partially overlapping the orthographic projection of the PN junction on the substrate.

3. The semiconductor device according to claim 2, wherein when a Fermi energy level of a material of the first semiconductor structure is greater than a Fermi energy level of a material of the second semiconductor structure, a Fermi energy level of a material of the first conductive layer is less than the Fermi energy level of the material of the first semiconductor structure, and a Fermi energy level of a material of the second conductive layer is greater than the Fermi energy level of the material of the second semiconductor structure.

4. The semiconductor device according to claim 2, wherein when a Fermi energy level of a material of the first semiconductor structure is greater than a Fermi energy level of a material of the second semiconductor structure, a Fermi energy level of a material of the first conductive layer and a Fermi energy level of a material of the second conductive layer are both greater than the Fermi energy level of the material of the first semiconductor structure, and a differential obtained by subtracting the Fermi energy level of the material of the first semiconductor structure from the Fermi energy level of the material of the first conductive layer being less than a differential obtained by subtracting the Fermi energy level of the material of the second semiconductor structure from the Fermi energy level of the material of the second conductive layer.

5. The semiconductor device according to claim 2, wherein when a Fermi energy level of a material of the first semiconductor structure is greater than a Fermi energy level of a material of the second semiconductor structure, a Fermi energy level of a material of the first conductive layer and a Fermi energy level of a material of the second conductive layer are both less than the Fermi energy level of the material of the first semiconductor structure, and a differential obtained by subtracting the Fermi energy level of the material of the first conductive layer from the Fermi energy level of the material of the first semiconductor structure being greater than a differential obtained by subtracting the Fermi energy level of the material of the second conductive layer from the Fermi energy level of the material of the second semiconductor structure.

6. The semiconductor device according to claim 3, wherein the material of the first semiconductor structure is an N-type semiconductor, and the material of the second semiconductor structure is a P-type semiconductor.

7. The semiconductor device according to claim 2, wherein the PN junction comprises a first structure portion positioned in the first semiconductor structure and a second structure portion positioned in the second semiconductor structure, the orthographic projection of the first conductive layer on the substrate overlaying an orthographic projection of the first structure portion on the substrate.

8. The semiconductor device according to claim 2, wherein the PN junction comprises a first structure portion positioned in the first semiconductor structure and a second structure portion positioned in the second semiconductor structure, the orthographic projection of the second conductive layer on the substrate overlaying an orthographic projection of the second structure portion on the substrate.

9. The semiconductor device according to claim 1, wherein the first conductive layer and the second conductive layer are an integrative structure.

10. The semiconductor device according to claim 1, wherein the substrate is a lightly-doped N-type or P-type semiconductor.

11. A method for fabricating a semiconductor device, comprising:
    forming a substrate;
    forming a semiconductor structure on a side of the substrate, the semiconductor structure comprising a first semiconductor structure and a second semiconductor structure, the first semiconductor structure and the second semiconductor structure forming a PN junction;
    forming an insulating layer on a side of the semiconductor structure facing away from the substrate; and
    forming a conductive layer on a side of the insulating layer facing away from the substrate, an orthographic projection of the conductive layer on the substrate at least partially overlapping an orthographic projection of the PN junction on the substrate;
    wherein the conductive layer is configured to reduce a potential barrier of the PN junction formed by the first semiconductor structure and the second semiconductor structure;

wherein the conductive layer comprises a first conductive layer and a second conductive layer, the first conductive layer is a polysilicon conductor doped with a P-type ion, and the second conductive layer is a polysilicon conductor doped with an N-type ion.

12. The method for fabricating a semiconductor device according to claim 11, wherein forming a semiconductor structure on a side of the substrate comprises:

providing a semiconductor base; and performing N-type doping and P-type doping on the semiconductor base to form the first semiconductor structure and the second semiconductor structure from a part of the semiconductor base, a material of the first semiconductor structure being an N-type semiconductor, and a material of the second semiconductor structure being a P-type semiconductor.

13. The method for fabricating a semiconductor device according to claim 12, wherein forming a conductive layer on a side of the insulating layer facing away from the substrate comprises:

forming a polysilicon layer on the side of the insulating layer facing away from the substrate; and forming a first conductive layer by performing P-type ion doping on a part of the polysilicon layer, and forming a second conductive layer by performing N-type ion doping on a part of the polysilicon layer, the first conductive layer and the second conductive layer constituting the conductive layer;

wherein an orthographic projection of the first conductive layer on the substrate is positioned on an orthographic projection of the first semiconductor structure on the substrate, and the orthographic projection of the first conductive layer on the substrate at least partially overlapping the orthographic projection of the PN junction on the substrate; and wherein an orthographic projection of the second conductive layer on the substrate is positioned on an orthographic projection of the second semiconductor structure on the substrate, and the orthographic projection of the second conductive layer on the substrate at least partially overlapping the orthographic projection of the PN junction on the substrate.

* * * * *